(12) United States Patent
Matsubara

(10) Patent No.: US 11,894,837 B2
(45) Date of Patent: Feb. 6, 2024

(54) GATE DRIVING APPARATUS, SWITCHING APPARATUS AND GATE DRIVING METHOD

(71) Applicant: FUJI ELECTRIC CO., LTD., Kanagawa (JP)

(72) Inventor: Kunio Matsubara, Hino (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 17/209,245

(22) Filed: Mar. 23, 2021

(65) Prior Publication Data
US 2021/0376826 A1    Dec. 2, 2021

(30) Foreign Application Priority Data
May 28, 2020   (JP) .................................. 2020-093708

(51) Int. Cl.
*H03K 17/16* (2006.01)
*H03K 17/567* (2006.01)

(52) U.S. Cl.
CPC ......... *H03K 17/168* (2013.01); *H03K 17/567* (2013.01)

(58) Field of Classification Search
CPC .......................... H03K 17/168; H03K 17/567
See application file for complete search history.

(56) References Cited

U.S. PATENT DOCUMENTS 10,998,843 B2 * 5/2021 Baeurle ................. H02P 27/085
2008/0122497 A1   5/2008 Ishikawa

FOREIGN PATENT DOCUMENTS

| JP | H0946201 A | 2/1997 |
|---|---|---|
| JP | 5186095 B2 | 4/2013 |
| JP | 2014147237 A | * 8/2014 |
| JP | 2014147237 A | 8/2014 |
| JP | 5970225 B2 | 8/2016 |
| JP | 2018153006 A | * 9/2018 |
| JP | 2018153006 A | 9/2018 |

OTHER PUBLICATIONS

Office Action issued for counterpart Japanese Application No. 2020-093708, issued by the Japanese Patent Office dated Mar. 30, 2021 (dated Mar. 23, 2021).
Notice of Dispatch of Duplicates of a Written Opposition against counterpart Japanese Patent No. JP6943316B issued by the Japanese Patent Office dated Apr. 18, 2022.
"MOSFET gate drive circuit", TOSHIBA, Jul. 26, 2018, file://C:/Users/l_ma/Downloadsapplication_note_ja_20180726_AKX00023. pdf.
Notice of Reasons for Revocation and Translation against counterpart Japanese Patent No. JP6943316B issued by the Japanese Patent Office dated Jun. 30, 2022.

* cited by examiner

*Primary Examiner* — Metasebia T Retebo

(57) ABSTRACT

Provided is a gate driving apparatus, including: a gate driving unit for driving a gate of a switching device; a switching unit for switching a gate current of the switching device during, within a turn-on period of the switching device, at least a part of the period, which is after timing when a current starts to flow in the switching device, to a smaller current when compared to the gate current before at least a part of the period.

18 Claims, 4 Drawing Sheets

GATE DRIVING APPARATUS, SWITCHING APPARATUS AND GATE DRIVING METHOD

The contents of the following Japanese patent application are incorporated herein by reference:
2020-093708 filed in JP on May 28, 2020

BACKGROUND

1. Technical Field

The present invention relates to a gate driving apparatus, a switching apparatus and a gate driving method.

2. Related Art

Conventionally, various technologies have been proposed for suppressing surge voltage when switching devices are turned on (for example, refer to Patent Document 1).
Patent Document 1: U.S. Pat. No. 5,186,095
In recent years, there has been a growing demand to reduce switching loss while suppressing surge voltage.

SUMMARY

To solve the above-mentioned problem, a first aspect of the present invention provides a gate driving apparatus. The gate driving apparatus may include a gate driving unit for driving a gate of a switching device. The gate driving apparatus may include a switching unit for switching a gate current of the switching device during, within a turn-on period of the switching device, at least a part of the period, which is after timing when a current starts to flow in the switching device, to a smaller current when compared to the gate current before at least a part of the period.

The switching unit may be configured to change a change speed of a gate current of the switching device during the at least a part of the period, and reduce the gate current to be smaller than that before at least a part of the period.

The at least a part of the period may start after the timing when the current starts to flow in the switching device.

The gate driving apparatus may further include a first detection unit for detecting elapse of a first reference period, which is from first reference timing after a turn-on signal is input into the switching device to after timing when a current starts to flow in the switching device, and for supplying a signal to the switching unit.

The first reference timing may be after the input timing of the turn-on signal to the switching device. The switching device may be connected in series with an opposite switching device that is connected thereto in antiparallel to a freewheeling diode. The gate driving apparatus may further include a first acquisition unit for acquiring at least one of a parameter indicating a gate voltage of the switching device, a parameter showing a device voltage of the switching device, a parameter showing a current flowing in the switching device, and a parameter showing a current flowing in the freewheeling diode. The gate driving apparatus may further include a second detection unit for detecting the first reference timing, and supplying a signal to the first detection unit based on a parameter acquired by the first acquisition unit.

The first reference timing may be an input timing of a turn-on signal to the switching device.

The switching device may be connected in series with an opposite switching device that has a freewheeling diode connected thereto in antiparallel. The at least a part of the period may include timing when a current flowing in the freewheeling diode becomes zero.

The gate driving apparatus may further include a second acquisition unit for acquiring at least one of a parameter showing a current flowing in the freewheeling diode and a parameter showing a current flowing in the switching device. The gate driving apparatus may further include a third detection unit for detecting that a current flowing in the freewheeling diode has become zero and supplying a signal to the switching unit based on the parameter acquired by the second acquisition unit.

The gate driving apparatus may further include a fourth detection unit for detecting elapse of a second reference period, which is from a second reference timing after a turn-on signal is input into the switching device to that after a timing when a current flowing in the freewheeling diode becomes zero, and supplying a signal to the switching unit.

The switching unit may be configured to switch a gate current of the switching device after the at least a part of the period of the turn-on period, to a greater current when compared with the gate current during the at least a part of the period.

The switching unit has a gate resistor connected to a gate of the switching device, and may be configured to switch a resistor value of the gate resistor.

The switching unit has a power source connected to a gate of the switching device, and may be configured to switch a voltage of the power source.

The switching unit may be configured to switch a gate current of the switching device for a plurality of times in a stepped manner during the at least a part of the period.

A second aspect of the present invention provides a switching apparatus. The switching apparatus may include the gate driving apparatus of the first aspect. The switching apparatus may include a switching device with a gate driven by the gate driving apparatus.

The switching device may be a wide bandgap semiconductor device.

A third aspect of the present invention provides a gate driving method for driving a gate of the switching device. The gate driving method may include switching a gate current of the switching device during, within a turn-on period of the switching device, at least a part of the period, which is after a timing when a current starts to flow in the switching device, to a smaller current when compared to the gate current before the at least a part of the period.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described through embodiments of the invention, but the following embodiments do not limit the invention according to the claims. Further, not all the combinations of features described in the embodiments are essential for means to solve the problem in the invention.

Figure 1:
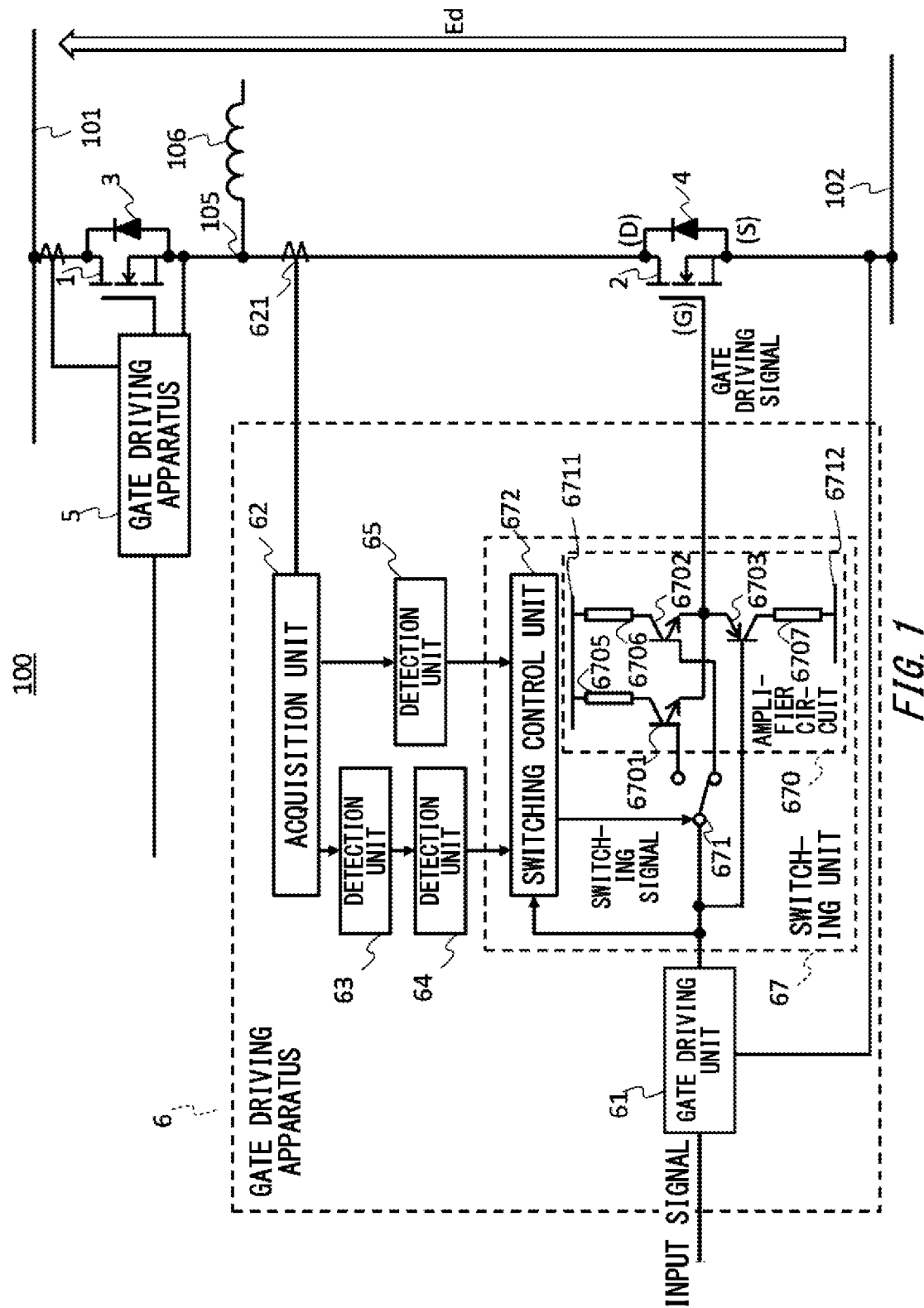
FIG. 1 illustrates a switching apparatus 100 according to this embodiment.

[1. Configuration of switching apparatus 100] FIG. 1 illustrates a switching apparatus 100 according to this embodiment. It is noted that in the figure, an outlined arrow indicates a voltage.

The switching apparatus 100 shows one phase of a power conversion apparatus that is used for motor drive or power feed, as an example, and outputs a voltage converted from a power source output terminal 105 by switching a connection between a positive-side power source line 101 and a negative-side power source line 102 and the power source output terminal 105.

Here, a direct current voltage Ed of 600 to 800 V, for example, is applied between the positive-side power source line 101 and the negative-side power source line 102, and the negative-side power source line 102 is connected to a reference potential (as an example, a ground potential) of the entire switching apparatus 100. The power source output terminal 105 may have an induction load 106 connected thereto. The switching apparatus 100 includes a positive-side main switching device 1 and a negative-side main switching device 2, freewheeling diodes 3 and 4 connected in antiparallel to the main switching devices 1 and 2, a positive-side gate driving apparatus 5 and a negative-side gate driving apparatus 6.

[1-1. Main switching devices 1 and 2] The main switching devices 1 and 2 are respectively an example of a switching device, and are configured to electrically connect or disconnect between a drain terminal and a source terminal. For example, the main switching devices 1 and 2 are configured to switch between an on-state (also referred to as connected) and an off-state (also referred to as disconnected) by gate driving apparatuses 5 and 6, which will be described below. Here, as one example of this embodiment, the main switching devices 1 and 2 are sequentially connected in series between the negative-side power source line 102 and the positive-side power source line 101, and constitute an upper arm and a lower arm of the power conversion apparatus. A center point between the main switching devices 1 and 2 has the power source output terminal 105 connected thereto.

Each of the main switching devices 1 and 2 is a silicon semiconductor element based on silicon. Alternatively, at least one of the main switching devices 1 and 2 may be a wide bandgap semiconductor element. The wide bandgap semiconductor element is a semiconductor element in which the bandgap is greater than that of a silicon semiconductor element, and is, for example, a semiconductor element including SiC, GaN, diamond, a gallium nitride-based material, a gallium oxide-based material, AlN, AlGaN, ZnO, or the like. The wide bandgap semiconductor element enables the switching speed to be improved, as compared to the silicon semiconductor element. It is noted that in this example, the main switching devices 1 and 2 are respectively a MOSFET (Metal Oxide Semiconductor Field Effect Transistor), and may include a parasitic diode (not illustrated) of which the side facing toward the positive-side power source line 101 is a cathode.

[1-2. Freewheeling diodes 3 and 4] The freewheeling diodes 3 and 4 are connected in antiparallel to the main switching devices 1 and 2. The freewheeling diodes 3 and 4 may respectively be a Schottky barrier diode or may be a parasitic diode of a MOSFET. The freewheeling diodes 3 and 4 may respectively be a silicon semiconductor element or may be a wide bandgap semiconductor element.

[1-3. Gate driving apparatuses 5 and 6] The gate driving apparatuses 5 and 6 are configured to drive the gates (also referred to as gate terminals) of the corresponding main switching devices 1 and 2, based on an input signal to be input from the outside. The input signal may control the main switching devices 1 and 2 in a PWM control manner, thereby outputting an alternating current of a substantial sine wave from the power source output terminal 105. The input signal may be individually input to the main switching device 1 and the main switching device 2. It is noted that as one example in this embodiment, in a case where the input signal is high (on-command signal), it instructs the main switching device 2 to be in an on-state, and in a case where the input signal is low (off-command signal), it instructs the main switching device 2 to be in an off-state. When the main switching devices 1 and 2 are alternately turned to the on-state by the input signal, either of the main switching devices 1 and 2 may be turned to the on-state after both of the main switching devices 1 and 2 has been turned to the off-state.

The positive-side gate driving apparatus 5 is configured to drive the gate of the main switching device 1, and the negative-side gate driving apparatus 6 is configured to drive the gate of the main switching device 2. It is noted that the gate driving apparatuses 5 and 6 have similar configurations, so in this embodiment, the negative-side gate driving apparatus 6 is described, and the descriptions of the positive-side gate driving apparatus 5 are omitted.

The gate driving apparatus 6 has a gate driving unit 61, an acquisition unit 62, detection units 63 to 65, and a switching unit 67. As one example of this embodiment, each unit of the gate driving apparatus 6 is described as an analog circuit.

[1-3-1. Gate driving unit 61] The gate driving unit 61 is configured to drive the gate of the main switching device 2, based on a turn-on signal (a rising signal) and a turn-off signal (a falling signal) included in the input signal from the outside. The gate driving unit 61 is configured to supply gate driving signals (on-command signal/off-command signal) for on/off instructions to a gate terminal of the main switching device 2. As one example of this embodiment, the gate driving signal may become high in the case of an on instruction of the main switching device 2. The gate driving unit 61 may be connected to a source terminal of the main switching device 2, and may be configured to use a potential of a source terminal as a reference potential of the gate driving signal.

[1-3-2. Acquisition unit 62] The acquisition unit 62 is one example of the first acquisition unit and the second acquisition unit, and is configured to acquire a parameter related to the switching timing of the switching unit 67. For example, the acquisition unit 62 may acquire a parameter showing the current flowing in the main switching device 2. As one example of this embodiment, the acquisition unit 62 may acquire a drain current Id from a current sensor 621. The acquisition unit 62 may acquire a parameter during the turn-on period of the main switching device 2. The acquisition unit 62 may supply the acquired parameter to the detection units 63 and 65.

[1-3-3. Detection unit 63] The detection unit 63 is one example of the second detection unit, and is configured to detect the first reference timing. The detection unit 63 may detect the first reference timing based on the acquired parameter by the acquisition unit 62. For example, the detection unit 63 may be a comparator for comparing the parameter with a reference value. The detection unit 63 may supply a signal showing the first reference timing to the detection unit 64.

Here, the first reference timing is the start timing of the first reference period for switching the mode by the switching unit 67. The first reference timing may be timing after the input of the turn-on signal to the main switching device 2, and as one example of this embodiment, is timing after the input timing of a turn-on signal to the main switching device 2.

Also, the first reference period is a period from the first reference timing up to after the timing when a current starts to flow in the main switching device 2. The end of the first reference period may be any timing after the timing when the current starts to flow in the main switching device 2 and before the timing when the current flowing in the freewheeling diode 3 becomes zero. The first reference period may be premeasured before shipping the switching apparatus 100 and set by the detection unit 63.

[1-3-4. Detection unit 64] The detection unit 64 is one example of the first detection unit, and is configured to detect the elapse of the first reference period from the first reference timing. For example, the detection unit 64 may include an integrating circuit for outputting the voltage according to the elapsed period from the first reference timing, and a comparator for comparing the voltage from the integrating circuit with a reference value. The detection unit 64 may supply the signal showing the elapse of the first reference period to the switching unit 67.

[1-3-5. Detection unit 65] The detection unit 65 is one example of the third detection unit, and is configured to detect that the current flowing in the freewheeling diode 3 has become zero. The detection unit 65 may perform the detection based on the parameter (the parameter showing the current flowing in the main switching device 2 as one example of this embodiment) acquired by the acquisition unit 62. For example, the detection unit 65 may detect that the current flowing in the freewheeling diode 3 has become zero, by detecting that the current flowing in the main switching device 2 has reached the current in a steady on-state of the main switching device 2. The detection unit 65 may be a comparator for comparing the parameter with a reference value. The detection unit 65 may supply a signal showing that the current flowing in the freewheeling diode 3 has become zero to the switching unit 67.

[1-3-6. Switching unit 67] The switching unit 67 is configured to switch the gate current of the main switching device 2 during, of the turn-on period of the main switching device 2, at least a part of the period (also referred to as a reducing period) which is after the timing when the current starts to flow in the main switching device 2, to a smaller current when compared with that before the reducing period. The switching unit 67 may reduce the gate current by switching the connection. The switching unit 67 changes the change speed of the gate current of the main switching device 2 during the reducing period, and may reduce the gate current to be smaller than that before the reducing period.

The reducing period may also start from the timing when the current starts to flow in the main switching device 2, but as one example in this embodiment, it starts after this timing. The start of the reducing period may be detected by the detection unit 64.

Also, the reducing period may include the timing when the current flowing in the freewheeling diode 3 becomes zero. In other words, the end of the reducing period may be after the timing when the current flowing in the freewheeling diode 3 becomes zero. The end of the reducing period may be detected by the detection unit 65.

The switching unit 67 has an amplifier circuit 670, a connection switching unit 671 and a switching control unit 672.

[1-3-6-1. Amplifier circuit 670] The amplifier circuit 670 is configured to amplify the gate driving signal from the gate driving unit 61 and to supply it to the gate terminal of the main switching device 2. The amplifier circuit 670 has positive-side switching devices 6701 and 6702, positive-side resistors 6705 and 6706, negative-side switching device 6703 and negative-side resistor 6707 between the positive-side power source line 6711 and the negative-side power source line 6712.

The positive-side switching devices 6701 and 6702 are elements for turning on the main switching device 2, and connected in parallel between the positive-side power source line 6711 and the gate terminal of the main switching device 2. The positive-side switching devices 6701 and 6702 are respectively an npn-type bipolar transistor, and may be turned on when the gate driving signal input by the base terminal becomes high and supply a current from the positive-side power source line 6711 to the gate terminal of the main switching device 2.

The positive-side resistors 6705 and 6706 are respectively one example of the gate resistor, and is connected to the gate of the main switching device 2. For example, the resistors 6705 and 6706 are connected in parallel between the positive-side power source line 6711 and the gate terminal of the main switching device 2, and may be connected in series respectively with the positive-side switching devices 6701 and 6702. The resistors 6705 and 6706 respectively have resistor values that are different from each other. As one example of this embodiment, the resistor value of the resistor 6705 is smaller than the resistor value of the resistor 6706.

The negative-side switching device 6703 is an element for turning off the main switching device 2, and may be connected between the negative-side power source line 6712 and the gate terminal of the main switching device 2. The negative-side switching device 6703 is a pnp-type bipolar transistor, and may be turned on when the gate driving signal input by the base terminal becomes low and extract charges from the negative-side power source line 6712 from the gate terminal of the main switching device 2.

The negative-side resistor 6707 is connected in series with the negative-side switching device 6703, between the gate terminal of the main switching device 2 and the negative-side power source line 6712.

[1-3-6-2. Connection switching unit 671] The connection switching unit 671 is configured to switch the resistor value of the gate resistor between the resistor value of the resistor 6705 and the resistor value of the resistor 6706. In this way, the gate current is to be switched.

The connection switching unit 671 may electrically connect any one of the two resistors 6705 and 6706 alternatively to the gate. As one example of this embodiment, the connection switching unit 671 connects any one of the base terminal of the switching device 6701 and the base terminal of the switching device 6702 to the gate driving unit 61.

[1-3-6-3. Switching control unit 672] The switching control unit 672 is configured to control the gate current during the turn-on period by controlling the connection switching unit 671 according to a signal supplied from the detection units 64 and 65. The switching control unit 672 may connect the resistor 6706 to the gate terminal during the reducing period, and connect the resistor 6705 to the gate before and after the reducing period of the turn-on period of the main switching device 2 according to the switching signal to the connection switching unit 671. In this way, during the reducing period, the gate current of the main switching device 2 is switched to a smaller current when compared with that before the reducing period, and after the reducing period, the gate current of the main switching device 2 is switched to a greater current when compared with that during the reducing period. The switching control unit 672 may connect the resistor 6705 to the gate terminal by the start of the next turn-on at the latest when the turn-on of the main switching device 2 has completed.

According to the above switching apparatus 100, the gate current of the main switching device 2 is switched to a smaller current when compared with that before the reducing period during the reducing period of the turn-on period of the main switching device 2 after the timing when the current starts to flow in the main switching device 2. Accordingly, since the rate of change of the current flowing in the freewheeling diode 3 can be reduced, the surge voltage generated by the reverse recovery of the freewheeling diode 3 can be reduced, and the device destruction due to the surge voltage can be prevented. Also, since the reducing period starts after the timing when the current starts to flow in the main switching device 2, unlike in a case where the reducing period starts before the timing when the current starts to flow, the rate of change of the gate current, and thus the gate voltage, can be prevented from decreasing, and the turn-on period can be prevented from extending, thereby reducing the switching loss.

Also, since the reducing period starts after the timing when the current starts to flow in the main switching device 2, when compared with a case where the reducing period starts before the current starts flowing, the turn-on period can be further shortened and the switching loss can be reduced.

Also, since the reducing period starts after the elapse of the first reference period is detected, which is from the first reference timing after a turn-on signal is input to the main switching device 2 to that after the timing when the current starts to flow in the main switching device 2, the reducing period can be ensured to be after the timing when the current starts to flow in the main switching device 2.

Also, since the first reference timing is detected based on the parameter acquired by the acquisition unit 62, unlike in a case where the elapse timing of a fixed period is detected as the first reference timing, the first reference timing can be ensured to be detected without depending on the state of the switching apparatus 100.

Also, since the timing when the current flowing in the freewheeling diode 3 becomes zero is included in the reducing period, the surge voltage generated due to the reverse recovery of the freewheeling diode 3 can be ensured to be reduced, and the device destruction due to the surge voltage can be prevented.

Also, since the current flowing in the freewheeling diode 3 is detected to have become zero based on the acquired parameter, unlike in a case where the elapse timing of a fixed period is detected as the timing when the current becomes zero, the timing when the current flowing in the freewheeling diode 3 becomes zero can be ensured to be included in the reducing period without depending on the state of the switching apparatus 100.

Also, since the change speed of the gate current changes during the reducing period and the gate current becomes smaller than that before the reducing period, the surge voltage generated due to the reverse recovery of the freewheeling diode 3 can be ensured to be reduced by steeply decreasing the gate voltage, and the device destruction due to the surge voltage can be prevented.

Figure 2:
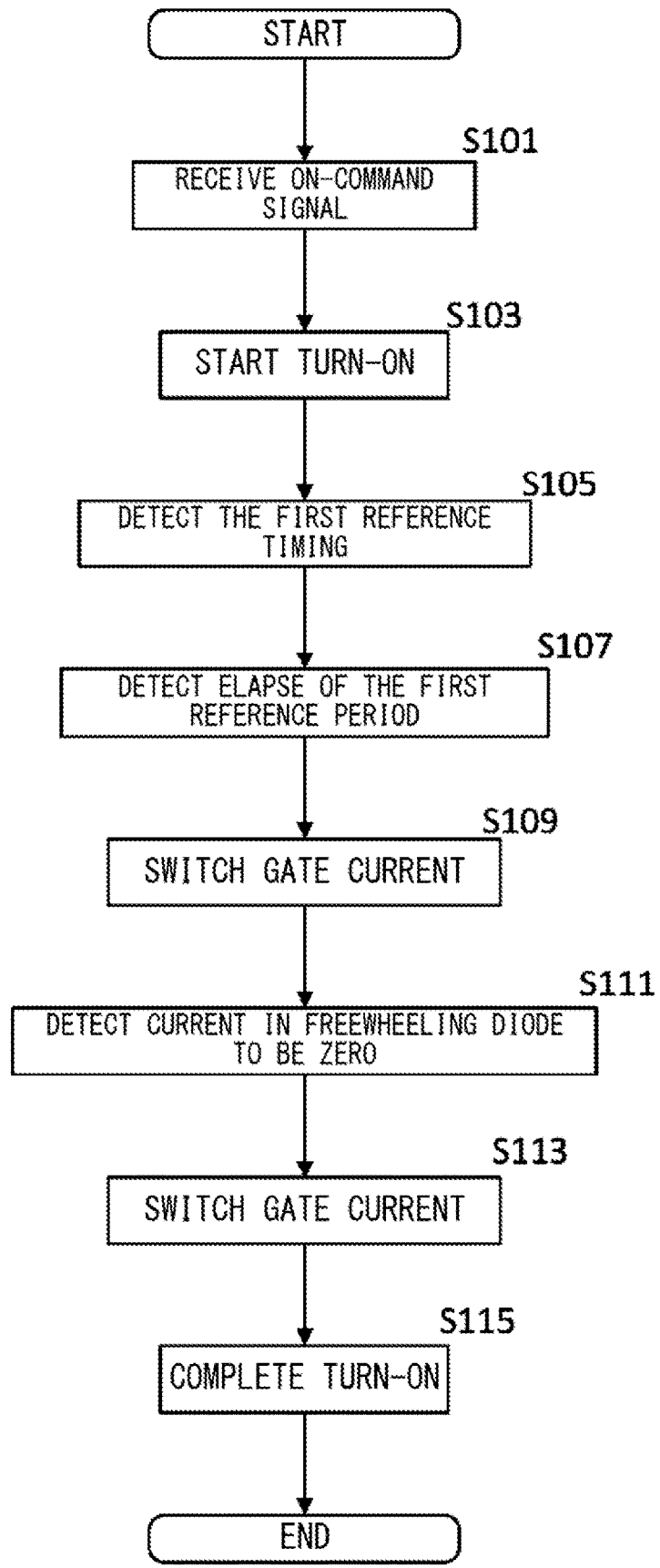
FIG. 2 illustrates operations of the switching apparatus 100.

[2. Operations] FIG. 2 illustrates the operations of the switching apparatus 100. The switching apparatus 100 is configured to drive the gate of the main switching device 2 and turns on the main switching device 2 by performing the processing of step S101 to S115.

In step S101, the gate driving unit 61 receives an on-command signal included in the input signal from the outside. In step S103, the gate driving unit 61 outputs a gate driving signal for instructing the turn-on and starts the turn-on of the main switching device 2. It is noted that, as one example of this embodiment, the resistor 6705 is connected to the gate terminal of the main switching device 2 when the turn-on of the main switching device 2 starts, and the gate current according to the resistor value of the resistor 6705 starts to flow to the gate by the gate driving signal. Also, the acquisition unit 62 starts to acquire the parameter showing the current flowing in the main switching device 2.

In step S105, the detection unit 63 detects the first reference timing. The detection unit 63 may detect the first reference timing based on the parameter acquired by the acquisition unit 62, and as one example of this embodiment, the timing when the current flowing in the main switching device 2 reaches a threshold value higher than zero is detected as the first reference timing. In this way, the first reference timing that is after the input timing of the turn-on signal to the main switching device 2 is detected.

In step S107, the detection unit 64 detects the timing when a first reference period has elapsed after the first reference timing. In this way, the timing after the current starts to flow in the main switching device 2 is detected, and then the reducing period starts. The detected timing may be the timing when the current flowing in the freewheeling diode 3 becomes zero, or may be the timing before that, as long as it is after the timing when the current starts to flow in the main switching device 2. As one example of this embodiment, the detected timing may be immediately before the timing when the current flowing in the freewheeling diode 3 becomes zero.

In step S109, the switching unit 67 switches the gate current of the main switching device 2 to be a smaller current than that before the reducing period. As one example of this embodiment, the switching unit 67 switches the gate resistor from the resistor 6705 to the resistor 6706 and changes the change speed of the gate current to reduce the gate current. The gate current may be reduced discontinuously from the timing before the reducing period.

In step S111, the detection unit 65 detects that the current flowing in the freewheeling diode 3 has become zero. The detection unit 65 may detect that the current flowing in the freewheeling diode 3 has become zero based on the parameter acquired by the acquisition unit 62, and as one example of this embodiment, by detecting that the current flowing in the main switching device 2 has reached the current of a steady on-state of the main switching device 2, the detection unit 65 detects that the current flowing in the freewheeling diode 3 has become zero. In this way, the reducing period ends.

In step S113, the switching unit 67 switches the gate current of the main switching device 2 to be a current greater than that during the reducing period. As one example of this embodiment, the switching unit 67 switches the gate resistor from the resistor 6706 to the resistor 6705 to increase the gate current. In this way, the gate current during the reducing period becomes smaller than that before the reducing period, and the switching apparatus 100 ends its operations related to the turn-on.

Next, in step S115, the turn-on of the main switching device 2 is completed, and the operations of the switching apparatus 100 related to the turn-on ends.

Figure 3:
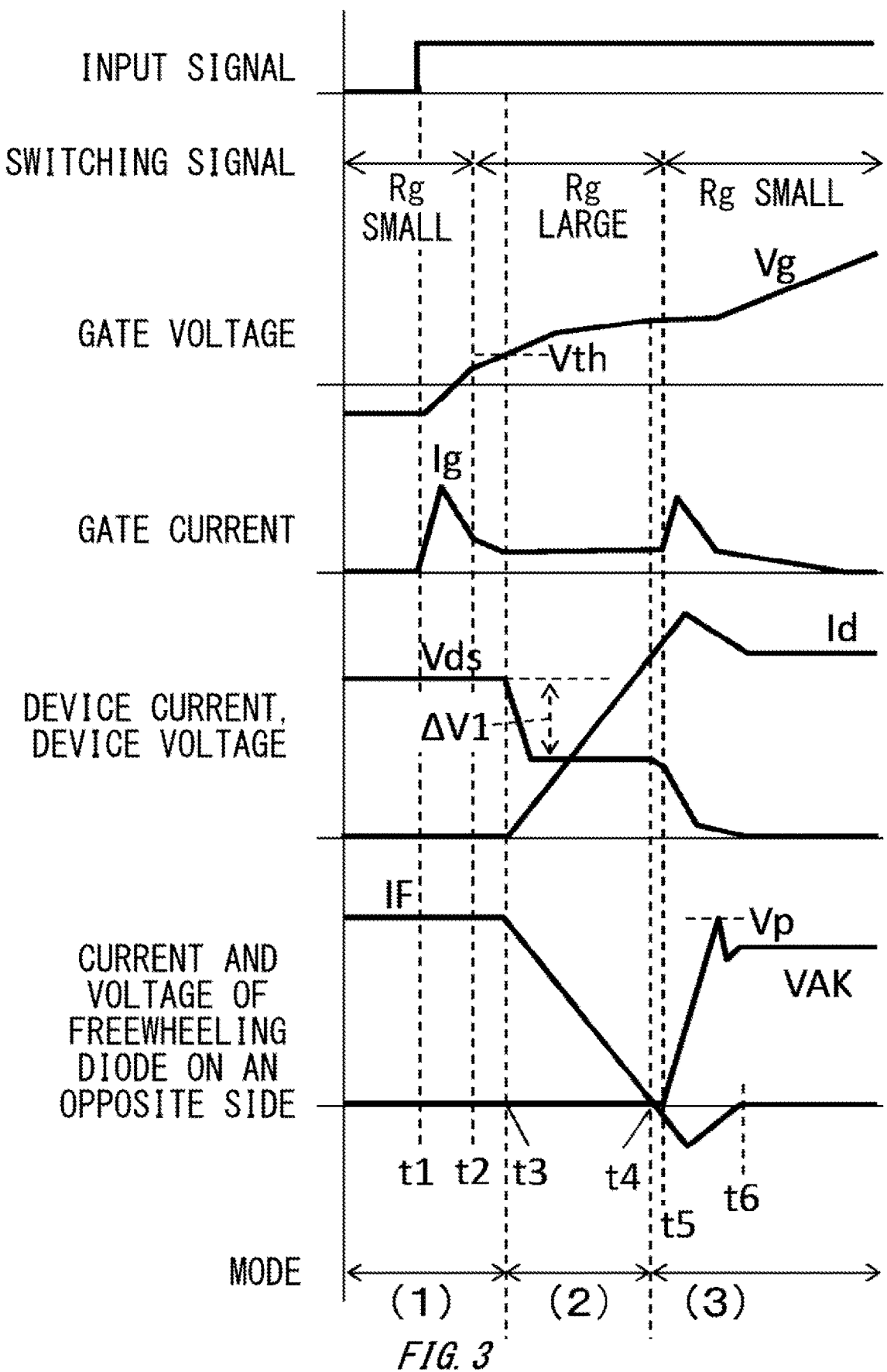
FIG. 3 illustrates operation waveforms when a main switching device 2 is turned on by a switching apparatus of a comparative example.

[3. Operation waveform] [3-1. Operation waveform according to the switching apparatus of the comparative example] FIG. 3 illustrates operation waveforms when the main switching device 2 is turned on by the switching apparatus of a comparative example of this embodiment. The switching apparatus of the comparative example reduces the gate current of the main switching device 2, suppresses the rate of change of the device current Id and thus the rate of change of the current flowing in the freewheeling diode 3, and reduces the surge voltage generated due to the reverse recovery of the freewheeling diode 3, by increasing the gate resistor in advance before the gate voltage Vg of the main switching device 2 exceeds the threshold voltage Vth.

Figure 4:
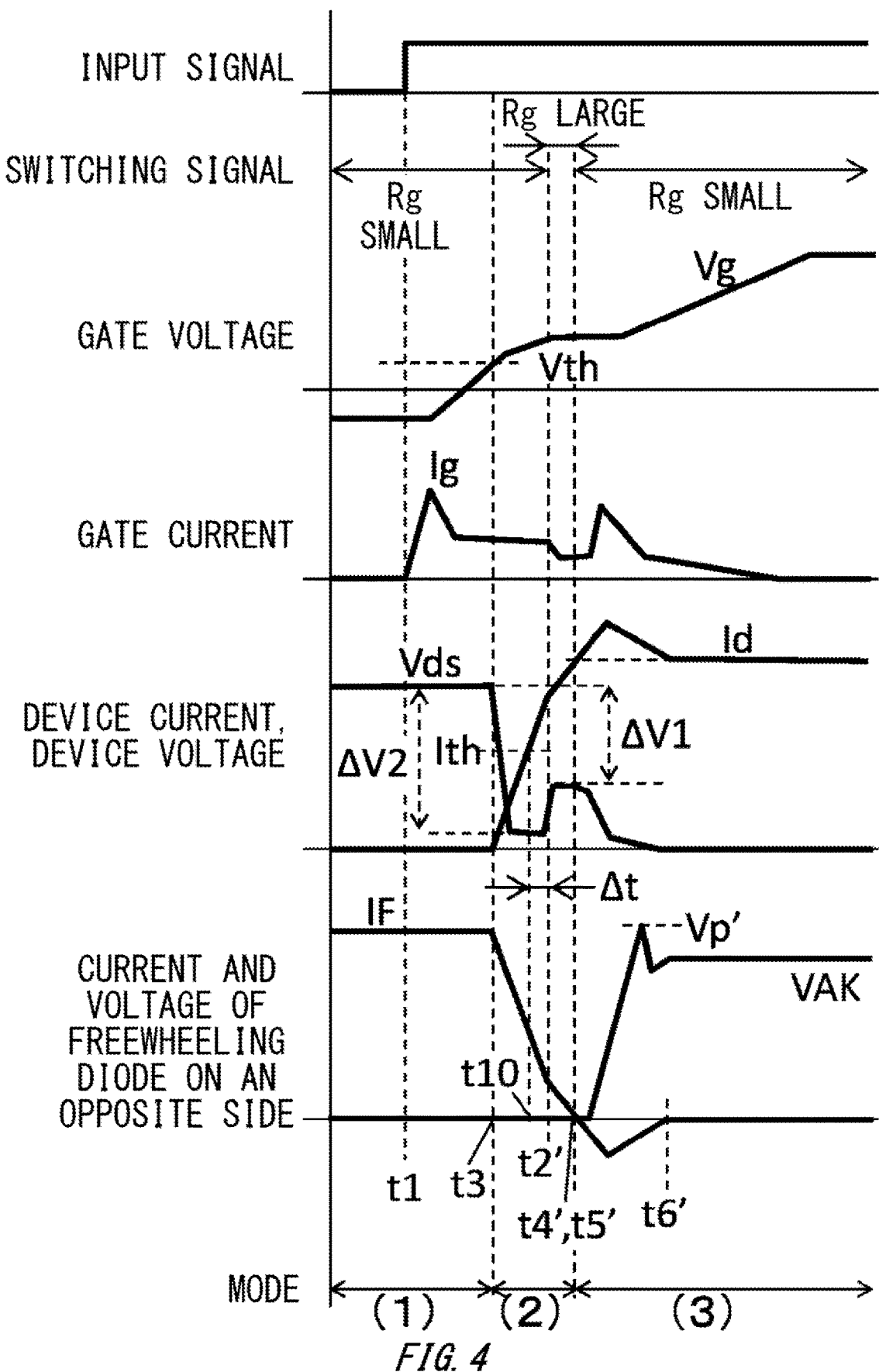
FIG. 4 illustrates operation waveforms when the main switching device 2 is turned on by the switching apparatus 100.

It is noted that in FIG. 3 and in FIG. 4 described below, the horizontal axis indicates time, and the vertical axis indicates the input signal to the main switching device 2, the switching signal from the switching control unit 672, the gate voltage Vg, the gate current Ig, the device current (the drain current) Id and the device voltage (the drain-source voltage) Vds of the main switching device 2, the current IF flowing in the freewheeling diode 3, the device voltage (anode-cathode voltage) VAK of the freewheeling diode 3, and the mode of the switching apparatus. Among these, the switching signal is illustrated as "Rg small" when connecting the resistor 6705 with a small resistor value to the gate terminal, and as "Rg large" when connecting the resistor 6706 with a large resistor value to the gate terminal. Further, regarding the mode of the switching apparatus, the period until the start of the increase of the device current Id of the main switching device 2, and the start of the decrease of the current IF of the freewheeling diode 3 after the on-command signal is input to the main switching device 2 is illustrated as mode (1), the period after mode (1) until the current IF flowing in the freewheeling diode 3 is close to zero is illustrated as mode (2), and the period after mode (2) is illustrated as mode (3).

When the input signal for driving the main switching device 2 is switched from low (off-command) to high (on-command) at time point t1, with the resistor 6705 connected to the gate terminal of the main switching device 2, the gate driving signal from the gate driving unit 61 becomes high, and the gate current Ig starts to flow according to the resistor value of the resistor 6705 (in this comparative example, a resistor value lower than that of the resistor 6706). Also, the gate voltage Vg starts to rise.

When the switching control unit 672 connects the resistor 6706 to the gate terminal according to the switching signal at time point t2, the gate current Ig becomes smaller. Also, the rate of change of the gate voltage Vg becomes smaller.

When the gate voltage Vg reaches the threshold voltage Vth at time point t3, the device current Id starts to flow in the main switching device 2, and the current IF flowing in the freewheeling diode 3 starts to decrease. Further, the device voltage Vds decreases only by the voltage Δ V1= (L×d(Id)/dt) obtained by multiplying the inductance L or a wiring connected to the main switching device 2 by the rate of change of the device current Id.

The current IF flowing in the freewheeling diode 3 becomes zero at time point t4, and then when the switching control unit 672 connects the resistor 6705 to the gate terminal by the switching signal at time point t5, the gate current Ig increases. In this way, the turn-on is pushed forward. Further, the freewheeling diode 3 recovers in reverse and the surge voltage reaches the peak voltage Vp, and the turn-on period ends at time point t6.

In the above modification example, since the gate current Ig is reduced and the rate of change of the current flowing in the freewheeling diode 3 is suppressed during the period from time point t2 to t5 of the turn-on period from time point t1 to t6, the surge voltage generated due to the reverse recovery becomes smaller. However, the turn-on period becomes longer by the long amount of the period during which the gate current Ig is reduced and the switching loss becomes greater.

[3-2. Operation waveform according to the switching apparatus 100 of the embodiment] FIG. 4 illustrates operation waveforms when the main switching device 2 is turned on by the switching apparatus 100 of this embodiment.

In the switching apparatus 100 according to this embodiment, as is the case with the comparative example described above, when the input signal is switched from low (off-command) to high (on-command) at time point t1, the gate current Ig according to the resistor value of the resistor 6705 (a resistor value lower than the resistor 6706 in this exemplary operation) flows and the gate voltage Vg starts to rise.

When the gate voltage Vg reaches the threshold voltage Vth at time point t3, the device current Id starts to flow in the main switching device 2, and the current IF flowing in the freewheeling diode 3 starts to decrease.

Here, in the switching apparatus 100 according to this embodiment, at time point t3 when the gate voltage Vg reaches the threshold voltage Vth, the resistor 6705 is connected to the gate terminal of the main switching device 2. Therefore, as a result of the gate current Ig being maintained to be higher and the rate of change of the device current Id being maintained to be higher when compared with the comparative example, the device voltage Vds decreases only by voltage Δ V2 that is greater than voltage Δ V1. Also, the rate of change of the current IF flowing in the freewheeling diode 3 is maintained to be high when compared with the comparative example.

At time point t10, the detection unit 63 detects the first reference timing when the device current Id reaches the threshold current Ith, and at time point t2', the detection unit 64 detects, as the first reference timing, the timing of the elapse of the first reference period Δ t from time point t10, that is, the start timing of the reducing period.

When the start timing is detected, the switching control unit 672 connects the resistor 6706 to the gate terminal by the switching signal. In this way, the change speed of the gate current Ig changes, and the gate current Ig becomes smaller. Also, the rate of change of the gate voltage Vg becomes smaller. Here, time point t2' may be after time point t3 when the gate voltage Vg reaches the threshold voltage Vth, and may be before time point t4' when the current IF flowing in the freewheeling diode 3 becomes zero. If time point t2' is before time point t4', as a result of the change of the device current Id and the current IF of the freewheeling diode 3 being gradual, the magnitude of the current flowing from the cathode terminal side to the anode terminal side of the freewheeling diode 3 becomes smaller due to the reverse recovery, and the surge voltage caused by the reverse recovery is decreased.

When the detection unit 65 detects that the current IF flowing in the freewheeling diode 3 has become zero at time point t4', the switching control unit 672 connects the resistor 6705 to the gate terminal according to the switching signal at time point t5' immediately after that. As a result, the change speed of the gate current changes, the gate current Ig becomes greater, and the turn-on is pushed forward. Also, the freewheeling diode 3 recovers in reverse, the surge voltage reaches the peak voltage Vp', and at time point t6', the turn-on period ends. It is noted that in this exemplary operation, in the period from time point t3 to t2', since the rate of change of the current IF flowing in the freewheeling diode 3 is large, time point t4' when the current IF is close to zero is earlier than time point t4 of the comparative example.

As described above, according to this exemplary operation, since the gate current Ig during the period from time point t2' to t5' of the turn-on period from time point t1 to t6' is decreased and the rate of change of the current flowing in the freewheeling diode 3 is suppressed, the peak voltage Vp' of the surge voltage generated due to the reverse recovery becomes smaller than the peak voltage Vp of the comparative example. Also, the turn-on period from t1 to t6' is shortened due to the short amount of the period during which the gate current Ig is reduced when compared to the period from time point t2 to t5 of the comparative example, and the switching loss is reduced.

[4. Modification example] It is noted that in the above-mentioned embodiment, although the acquisition unit 62 has been described to acquire a parameter showing the current flowing in the main switching device 2, in addition to/instead of this, it may also acquire at least one of a parameter showing the gate voltage Vg of the main switching device 2, a parameter showing the device voltage Vds of the main switching device 2, and a parameter showing the current IF flowing in the freewheeling diode 3. In a case where the parameter showing the gate voltage Vg is acquired, the detection unit 63 may detect the timing when the gate voltage Vg reaches the threshold voltage Vth as the first reference timing. When the parameter showing the device voltage Vds is acquired, the detection unit 63 may detect the timing when the device voltage Vds decreases and reaches the reference voltage as the first reference timing. When the parameter showing the current IF is output, the detection unit 63 may detect the timing when the current IF decreases and reaches the reference current as the first reference timing.

Also, although it has been described that the first reference timing is detected based on the parameter acquired by the acquisition unit 62, the input timing of the turn-on signal to the main switching device 2 may be referred to as the first reference timing. In this case, the detection unit 63 for detecting the first reference timing based on the parameter may not be included in the gate driving apparatus 6.

Also, although the reducing period has been described to start after the timing when the current starts to flow in the main switching device 2, it may also start at the timing when the current starts to flow in the main switching device 2. In this case, the detection unit 63 for detecting the first reference timing may not be included in the gate driving apparatus 6. Also, when the parameter showing the current Id flowing in the main switching device 2 is acquired, the detection unit 64 for detecting the start timing of the reducing period may detect the timing when the current Id becomes greater than zero. Also, when the parameter showing the gate voltage Vg is acquired, the detection unit 64 may detect the timing when the gate voltage Vg reaches the threshold voltage Vth. Also, when the parameter showing the device voltage Vds is acquired, the detection unit 64 may detect the timing when the device voltage Vds starts to decrease. Also, when the parameter showing the current IF flowing in the freewheeling diode 3 is output, the detection unit 64 may detect the timing when the current IF starts to decrease.

Also, although the detection unit 65 has been described to detect the current flowing in the freewheeling diode 3 having become zero based on the parameter showing the current Id flowing in the main switching device 2, in addition to/instead of this, it may also be detected based on the parameter showing the current flowing in the freewheeling diode 3. Also, the detection unit 65 may also detect the elapse of the second reference period from the second reference timing after a turn-on signal is input to the main switching device 2 to that after the timing when the current IF flowing in the freewheeling diode 3 becomes zero. The second reference period may be premeasured before shipping the switching apparatus 100 and set by the detection unit 65. The second reference timing may be the same as or may be different from the first reference timing. For example, the second reference timing may be the input timing of the turn-on signal, may be the timing when the gate current Ig increases, or may be the timing when the gate voltage Vg exceeds the threshold voltage Vth, may be the timing when the device voltage Vds of the main switching device 2 decreases, may be the timing when the current Id flowing in the main switching device 2 increases, or may be the timing when the current IF flowing in the freewheeling diode 3 decreases.

Also, although the switching unit 67 has been described to have two parallel resistors of the resistors 6705 and 6706 between the positive-side power source line 6711 and the gate terminal and to connect one of the resistors 6705 and 6706 alternatively to the gate terminal, as long as the gate current of the main switching device 2 can be reduced during the turn-on period, it may also have another configuration. For example, the switching unit 67 may also have two parallel resistors between the gate driving unit 61 and the gate terminal, and connect one of the resistors alternatively to the gate terminal. Also, the switching unit 67 may have three resistors with different resistor values, and may connect the respective resistors to the gate terminal before the reducing period, during the reducing period and after the reducing period. In this case, the resistor connected to the gate terminal during the reducing period may have the largest resistor value, and either of the resistor connected to the gate terminal before the reducing period and the resistor connected to the gate terminal after the reducing period may have a greater resistor value. Also, the switching unit 67 has a single variable resistor, and may reduce the gate current by switching the resistor value of the variable resistor.

Also, although the switching unit 67 has been described to reduce the gate current of the main switching device 2 by switching the gate resistor, it may also reduce the gate current by other means. For example, the switching unit 67 has one or more power sources connected to the gate terminal of the main switching device 2, and may also reduce the gate current by switching the voltage of the power source.

Also, although the switching unit 67 has been described to switch at once and reduce the gate current during the reducing period, it may also switch for a plurality of times in a stepped manner. In this case, when compared to the case where the gate current can be switched at once, since the gate current can be changed gradually, the surge voltage can be ensured to be reduced.

Also, although the switching apparatus 100 has been described to include a pair of the positive-side main switching device 1 and the gate driving apparatus 5, and a pair of the negative-side main switching device 2 and the gate driving apparatus 6, it may also only include either one of the pairs.

Also, each unit of the gate driving apparatus 6 has been described as an analog circuit, at least one of the detection units 63 to 65 and the switching control unit 672 may also be a digital circuit.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A gate driving apparatus comprising:
a gate driving unit for driving a gate of a switching device;
a switching unit for switching a slope of a gate current of the switching device, within a turn-on period of the switching device, from a first constant slope during at least a first part of the turn-on period to a second constant slope more negative than the first constant slope during at least a second part of the turn-on period after the first part of the turn-on period; and
an input to the switching unit, the input having two levels in operation: an ON level and an OFF level, wherein
the first part of the turn-on period is after a device current starts to flow in the switching device, and
a turn-on signal is continuously input to the switching device during the turn-on period, the turn-on period being a single cycle of the input to the switching unit at an ON level.

2. The gate driving apparatus according to claim 1, wherein:
the switching unit is configured to change a change speed of a gate current of the switching device during the first part of the turn-on period, and reduces the gate current to be smaller during the second part of the turn-on period than during the first part of the turn-on period.

3. The gate driving apparatus according to claim 1, wherein:
the switching device is connected in series with an opposite switching device that has a freewheeling diode connected thereto in antiparallel; and
the first part of the turn-on period includes timing when a current flowing in the freewheeling diode becomes zero.

4. The gate driving apparatus according to claim 2, wherein:
the switching device is connected in series with an opposite switching device that has a freewheeling diode connected thereto in antiparallel; and
the first part of the turn-on period includes timing when a current flowing in the freewheeling diode becomes zero.

5. The gate driving apparatus according to claim 1, wherein:
the switching unit is configured to switch a gate current of the switching device after the second part of the turn-on period, to a greater current when compared with the gate current during the turn-on period.

6. The gate driving apparatus according to claim 2, wherein:
the switching unit is configured to switch a gate current of the switching device after the second part of the turn-on period, to a greater current when compared with the gate current during the second part of the turn-on period.

7. The gate driving apparatus according to claim 1, wherein:
the switching unit has a gate resistor connected to the gate of the switching device, and is configured to switch a resistor value of the gate resistor.

8. The gate driving apparatus according to claim 2, wherein:
the switching unit has a gate resistor connected to the gate of the switching device, and is configured to switch a resistor value of the gate resistor.

9. The gate driving apparatus according to claim 1, wherein:
the switching unit has a power source connected to the gate of the switching device, and is configured to switch a voltage of the power source.

10. The gate driving apparatus according to claim 1, wherein:
the switching unit is configured to switch a gate current of the switching device for a plurality of times in a stepped manner during the first part of the turn-on period.

11. A switching apparatus comprising:
the gate driving apparatus according to claim 1; and
the switching device with a gate driven by the gate driving apparatus.

12. The switching apparatus according to claim 11, wherein:
the switching device is a wide bandgap semiconductor device.

13. The gate driving apparatus according to claim 1, wherein:
the gate current at a timing when current starts to flow in the switching device is maintained at the gate current before the first part of the turn-on period.

14. A gate driving apparatus comprising:
a gate driving unit for driving a gate of a switching device;
a switching unit for switching a gate current of the switching device during, within a turn-on period of the switching device, at least a part of a period, which starts after timing when a current starts to flow in the switching device, to a smaller current when compared to the gate current before the at least a part of the period; and
a first detection unit for detecting elapse of a first reference period, which is from first reference timing after a turn-on signal is input into the switching device to after the timing when the current starts to flow in the switching device, and for supplying a signal to the switching unit, wherein
the first reference timing is after an input timing of a turn-on signal to the switching device;
the switching device is connected in series with an opposite switching device that is connected in antiparallel to a freewheeling diode; and
the gate driving apparatus further comprises:
a first acquisition unit for acquiring at least one of a parameter indicating a gate voltage of the switching device, a parameter showing a device voltage of the switching device, a parameter showing a current flowing in the switching device, and a parameter showing a current flowing in the freewheeling diode; and a second detection unit for detecting the first reference timing, and supplying a signal to the first detection unit based on a parameter acquired by the first acquisition unit.

15. A gate driving apparatus comprising:

a gate driving unit for driving a gate of a switching device;

a switching unit for switching a gate current of the switching device during, within a turn-on period of the switching device, at least a part of a period, which starts after timing when a current starts to flow in the switching device, to a smaller current when compared to the gate current before the at least a part of the period;

the switching device is connected in series with an opposite switching device that has a freewheeling diode connected thereto in antiparallel;

the at least a part of the period includes timing when a current flowing in the freewheeling diode becomes zero;

a second acquisition unit for acquiring at least one of a parameter showing a current flowing in the freewheeling diode and a parameter showing a current flowing in the switching device; and a third detection unit for detecting that a current flowing in the freewheeling diode has become zero and supplying a signal to the switching unit based on a parameter acquired by the second acquisition unit.

16. A gate driving apparatus comprising:

a gate driving unit for driving a gate of a switching device, the switching device being connected in series with an opposite switching device that has a freewheeling diode connected thereto in antiparallel;

a switching unit for switching a gate current of the switching device during, within a turn-on period of the switching device, at least a part of a period, which is after timing when a current starts to flow in the switching device, to a smaller current when compared to the gate current before the at least a part of the period; and a fourth detection unit for detecting elapse of a second reference period, which is from a second reference timing after a turn-on signal is input into the switching device to that after a timing when a current flowing in the freewheeling diode becomes zero, and supplying a signal to the switching unit, wherein the at least a part of the period includes the timing when the current flowing in the freewheeling diode becomes zero.

17. The gate driving apparatus according to claim 16, wherein:

the switching unit is configured to change a change speed of a gate current of the switching device during that at least a part of the period, and reduces the gate current to be smaller than that before the at least a part of the period.

18. A gate driving method for driving a gate of a switching device, comprising:

switching a slope of a gate current of the switching device, within a turn-on period of the switching device, from a first constant slope during at least a first part of the turn-on period to a second constant slope more negative than the first constant slope during at least a second part of the turn-on period after the first part of the turn-on period; and an input to the switching unit, the input having two levels in operation: an ON level and an OFF level, wherein the first part of the turn-on period is after a device current starts to flow in the switching device, and a turn-on signal is continuously input to the switching device during the turn-on period, the turn-on period being a single cycle of the input to the switching unit at an ON level.

* * * * *